United States Patent [19]

Keough et al.

[11] 4,074,088

[45] Feb. 14, 1978

[54] KEYBOARD APPARATUS AND METHOD OF MAKING

[75] Inventors: Laurence J. Keough, Walpole; Bruce D. Butts, North Easton, both of Mass.

[73] Assignee: Texas Instruments Incorporated, Dallas, Tex.

[21] Appl. No.: 471,943

[22] Filed: May 21, 1974

[51] Int. Cl.[2] ...................... H01H 13/70; H01H 9/00; H05K 1/16

[52] U.S. Cl. ................................ 200/5 A; 200/159 B; 200/275; 200/292; 200/302; 174/68.5; 361/400; 340/365 R

[58] Field of Search .................... 200/5 R, 5 A, 67 R, 200/67 D, 67 DB, 159 R, 159 A, 159 B, 239, 245–247, 275, 281, 284, 292, 302; 197/98; 340/365 R, 365 A, 365 E; 361/400, 403; 174/68.5; 317/101 B, 101 C, 101 CC, 101 CP

[56] References Cited

U.S. PATENT DOCUMENTS

| | | | |
|---|---|---|---|
| 2,262,777 | 11/1941 | Roper | 200/159 B |
| 3,133,170 | 5/1964 | Nanninga | 200/67 DB |
| 3,749,859 | 7/1973 | Webb et al. | 200/5 A X |
| 3,796,843 | 3/1974 | Durkee et al. | 200/159 B |
| 3,806,673 | 4/1974 | Boulanger | 200/5 A |
| 3,808,384 | 4/1974 | Boulanger | 200/5 A |
| 3,831,063 | 8/1974 | Keough | 200/159 B X |

OTHER PUBLICATIONS

IBM Technical Disclosure Bulletin, E. Uberbacher, "Multistage Through-Hole", vol. 10, No. 7, Dec. 1967, p. 882.

*Primary Examiner*—James R. Scott
*Attorney, Agent, or Firm*—John A. Haug; James P. McAndrews

[57] ABSTRACT

A keyboard-operated electronic apparatus such as an electronic calculator is made by forming a dielectric card with a plurality of recesses in one card side. Preferably the card is formed with a number of apertures extending through the card. Electrically conductive films are deposited in a selected pattern on the recessed card to define first and complementary contacts within each card recess and to define circuit paths which are connected to these contacts in a selected manner. Electrically conductive elements of a dished configuration are disposed in the respective card recesses to be located by the recesses in engagement with the first contacts in the recesses, and key means are mounted on the recessed card side for selectively moving the dished elements with snap action into an inverted dished configuration so that the elements further engage complementary contacts in the recesses to close selected circuits. Preferably a flexible film is secured over the card recesses for dust sealing the contacts and snap-acting elements in the recesses. Electronic components are mounted directly on the recessed card, preferably by inserting component terminals into card apertures to be connected to circuit paths on the card.

14 Claims, 11 Drawing Figures

KEYBOARD APPARATUS AND METHOD OF MAKING

BACKGROUND OF THE INVENTION

Keyboard-operated devices such as pocket-sized electronic calculators and the like usually embody several flat dielectric cards having circuit paths provided on the cards. These cards are commonly made by covering one or both flat sides of the cards with a layer of copper and by etching the copper layers to form the desired circuit paths on the cards. One of the cards having such circuit paths on one side is then provided with contact means on the opposite side of the card, these contact means having portions extending through the card to electrically connect to the circuit paths on the card. Switching means such as snap-acting disc elements are also located on the opposite side of the card in selected relation to the card contacts and key means are provided for actuating the snap-acting switches to bridge selected pairs of contacts for completing selected circuits. Electronic components are then mounted on the other dielectric card with component terminals connected to selected circuit paths on the card and means are provided for interconnecting circuit paths on the two cards in a desired manner to form a complete electronic apparatus.

In this prior art approach to manufacture of keyboard-operated devices, the etched circuit cards represent a very significant element of cost. More important, the use of such cards imposes requirements for a number of assembly operations which must be performed with great care to avoid misalignments between various parts of the devices. For example, such care must be exercised in mounting contacts on the cards, in locating snap-acting elements to bridge the contacts, and in interconnecting circuit paths on the two dielectric cards. As a result, such prior art keyboard devices have been characterized by high material costs and by high assembly costs. The devices are also of somewhat limited durability and are subject to misalignments of different parts of the devices during use.

It is an object of this invention to provide a novel and improved keyboard apparatus; to provide such an apparatus which is of simple, compact and inexpensive structure; to provide novel and improved methods for making such apparatus; to provide such methods and apparatus which are characterized by economy of assembly; to provide such methods and apparatus which permit convenient apparatus assembly with a high degree of accuracy; and to provide such keyboard apparatus which is also rugged and reliable in use.

Briefly described, the novel and improved keyboard apparatus of this invention is made by forming a dielectric card with a plurality of recesses in one card side and, preferably, with a plurality of apertures extending through the card. Typically, the dielectric card is molded and each recess is formed with a recess bottom at one surface level, with a shoulder extending at least partly around the recess bottom forming a second surface level, and with a recess wall upstanding from the recess shoulder. This molded, multisurface level card is then subjected to an additive-type of metal deposition procedure to form electrically conductive contacts and circuit paths on the various surface levels of the card. Typically, first electrical contacts are deposited on each of the recess shoulders, complementary electrical contacts are formed at the bottom of each recess, and a circuit path pattern is deposited on one or both sides of the card and within selected card apertures, these circuit paths being electrically connected to the card contacts in a selected manner. Snap-acting electrically-conductive dished elements are then disposed in respective card recesses to be located by the walls of the recess in engagement with first contacts in the recesses and to be normally spaced from the complementary contacts in the recesses. Preferably, a flexible plastic film is secured over the recessed card side for dust sealing the dished elements and the contacts within each recess. Key means are then mounted on the recessed card side for selectively moving the snap-acting elements to an inverted dished configuration so that the snap-acting elements further engage the complementary contacts in the recesses to close selected circuits. Various electronic components necessary for completing the keyboard apparatus are mounted on the same dielectric card by inserting component terminals in card apertures to be electrically connected to selected circuit paths on the card. Preferably electrically conductive elastomers are secured in these card apertures for detachably holding the component terminals in the apertures while electrically connecting the component terminals to the circuit paths on the card.

In this arrangement, a single dielectric card is provided with all necessary electrical contact means and circuit path means in an inexpensive and reliable way, the contacts and circuit paths being connected to each other in the desired manner. The multilevel structure of the dielectric card properly locates the snap-acting switch elements relative to the card contacts for assuring proper operation of the snap-acting elements as device switches. These snap-acting switches are easily and reliably dust-sealed in the apparatus and electronic components required for completing the apparatus are easily mounted on the single dielectric card and are properly connected to circuit paths on the card in an economical and reliable way. Thus, the described apparatus is of very simple and economical construction, is easily and reliably assembled at low cost, and is rugged and compact during use.

BRIEF DESCRIPTION OF THE DRAWINGS

Other objects, advantages, and details of the keyboard apparatus and method of manufacture provided by this invention appear in the following detailed description of preferred embodiments of these inventions, the detailed description referring to the drawings in which.

DETAILED DESCRIPTION OF THE PREFERRED EMBODIMENT

Figure 1:
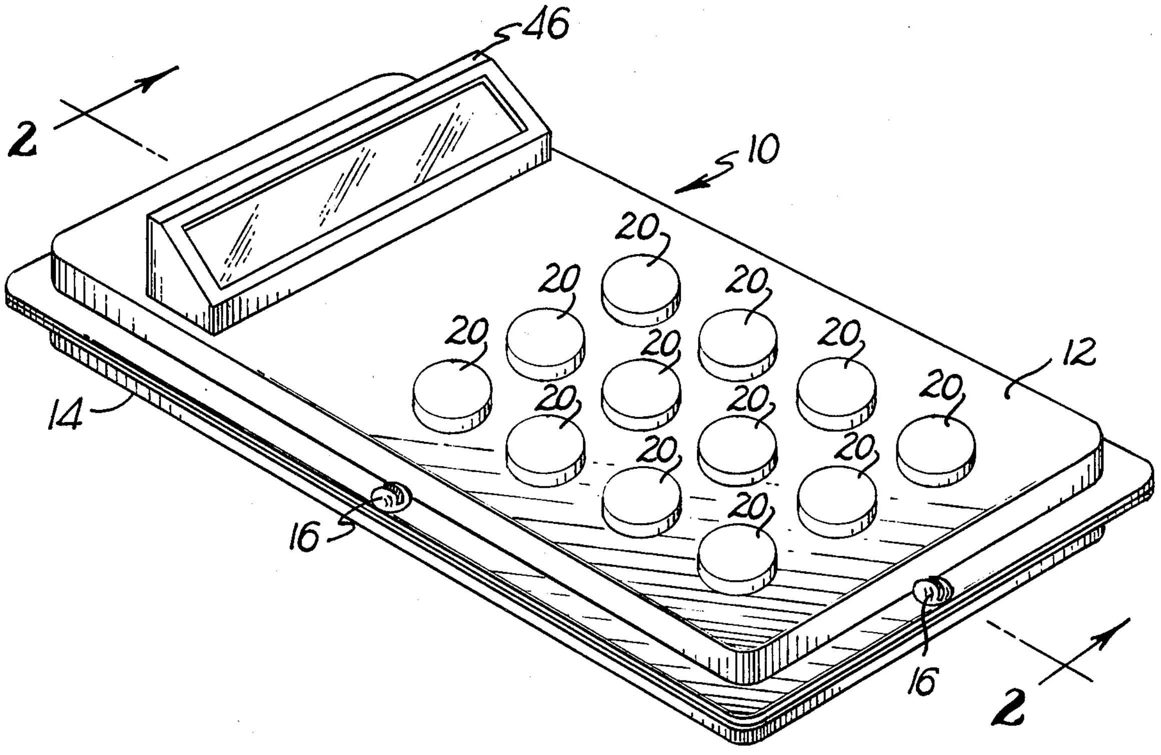
FIG. 1 is a perspective view of the novel and improved keyboard apparatus provided by this invention.
Figure 2:
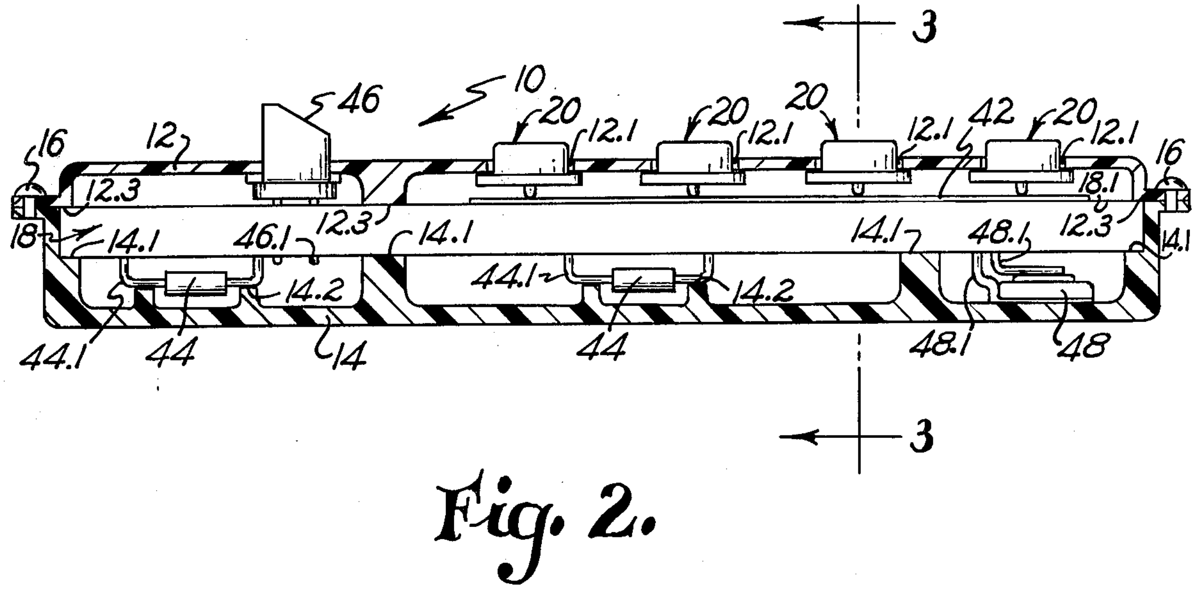
FIG. 2 is a section view along line 2—2 of FIG. 1.

Referring to the drawings, 10 in FIGS. 1 and 2 indicates the novel and improved keyboard apparatus of this invention which is shown to include casing halves 12 and 14 preferably formed of a semirigid plastic material such as polyethylene. As illustrated, the casing halves are secured together with screw means 16 or in other conventional ways for locating and enclosing a dielectric card 18 between the casing halves, the casing half 12 having a plurality of openings 12.1 for receiving key means 20 therein, having an additional opening 12.2, and having stepped portions 12.3 for normally bearing against portions of the dielectric card 18. The casing half 14 has similar stepped portions 14.1 bearing against the card 18 for precisly locating the card between the casing halves.

Figure 3:
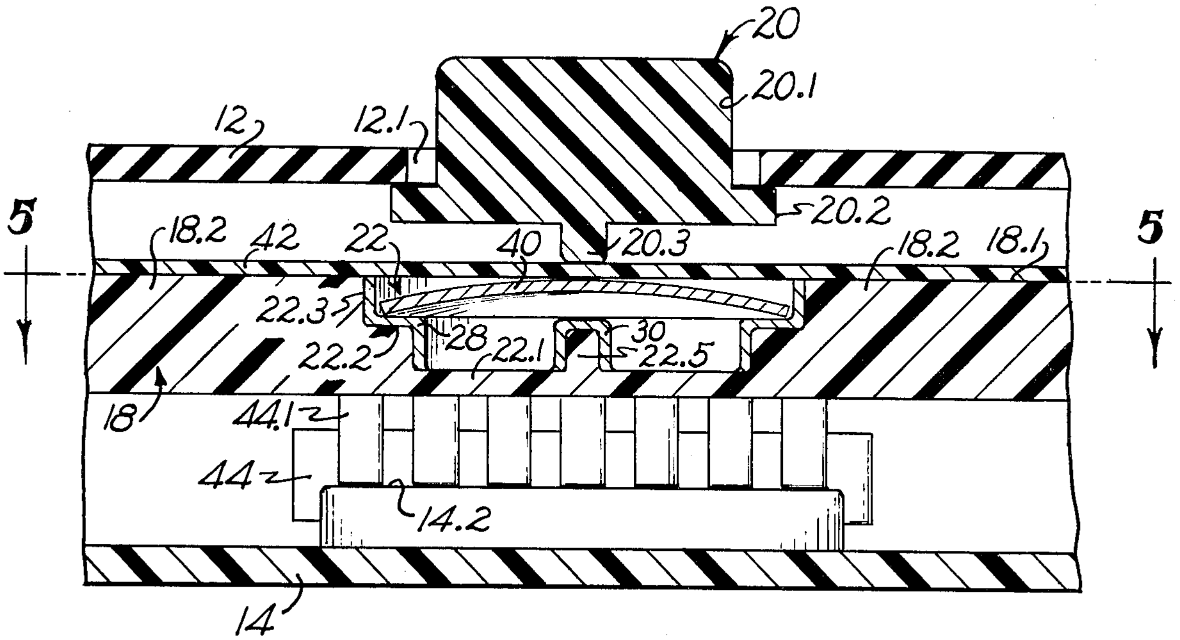
FIG. 3 is a partial section view to enlarged scale along line 3—3 of FIG. 2.
Figure 4:
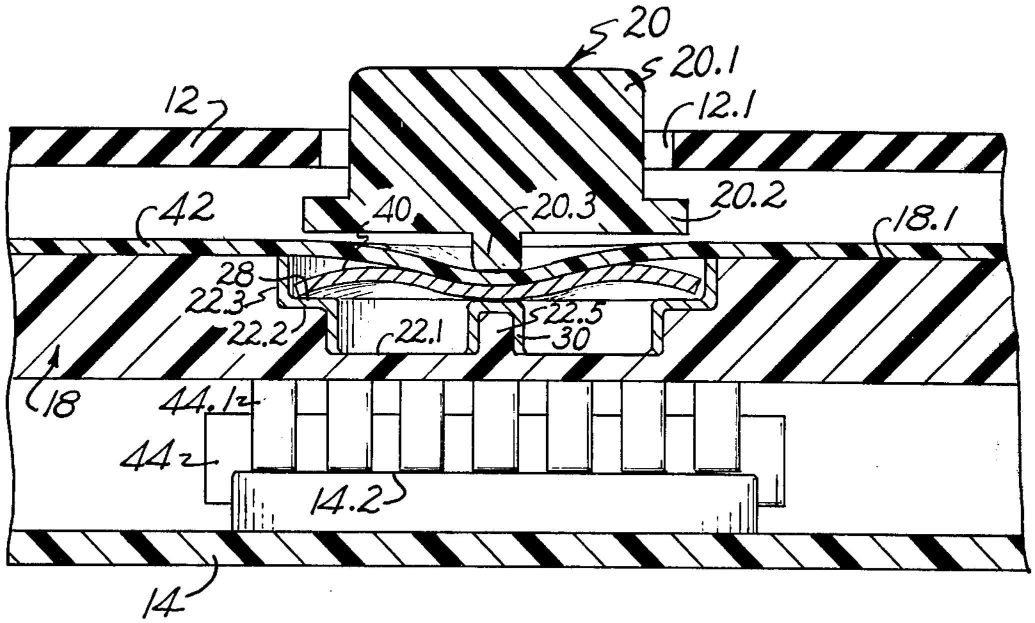
FIG. 4 is a partial section view similar to FIG. 3 illustrating the keyboard apparatus of this invention in an alternate operational position from what is shown in FIG. 3.
Figure 5:
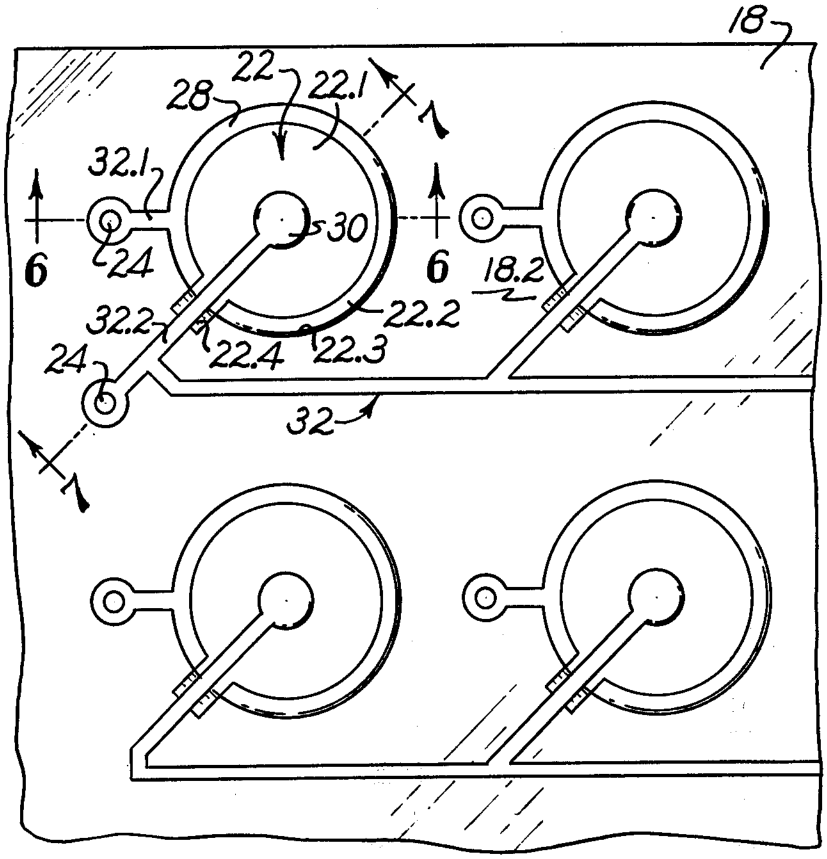
FIG. 5 is a partial section view along line 5—5 of FIG. 3.
Figure 7:
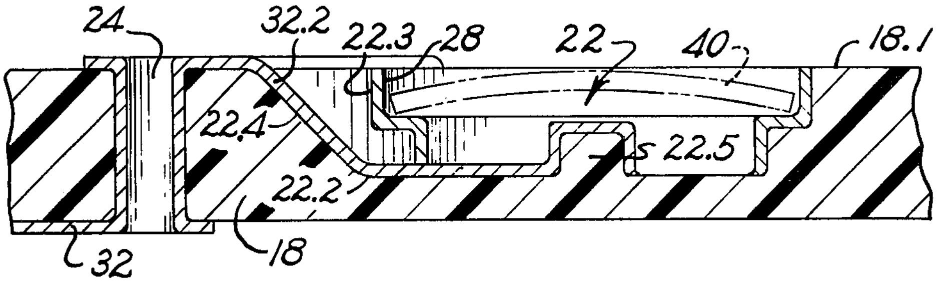
FIG. 7 is a partial section view along line 7—7 of FIG. 5.

In accordance with this invention, as shown in FIGS. 2–5, the dielectric card 18 is provided with a plurality of recesses 22 formed in one card side 18.1, these recesses being located so that one recess is automatically aligned with each one of the openings 12.1 in the top casing half 12 when the card is located between the casing halves 12 and 14. As shown, each of the card recesses 22 is formed so that each recess has a recess bottom 22.1, a recess shoulder 22.2 which extends at least partially around the recess bottom, and a recess wall 22.3 upstanding around the recess shoulder. Preferably, as is best shown in FIGS. 5 and 7, each recess is formed with an additional ramp or inclined surface 22.4 which extends from the recess bottom beneath the plane of the top of the recess shoulder 22.2 to a position outside the wall 22.3 of the recess, and which then extends up to the level of the outer surface 18.1 of the dielectric card. In this arrangement, each of the card recesses 22 is separated from the other card recesses by a portion 18.2 of the card located between the recesses.

Figure 9:
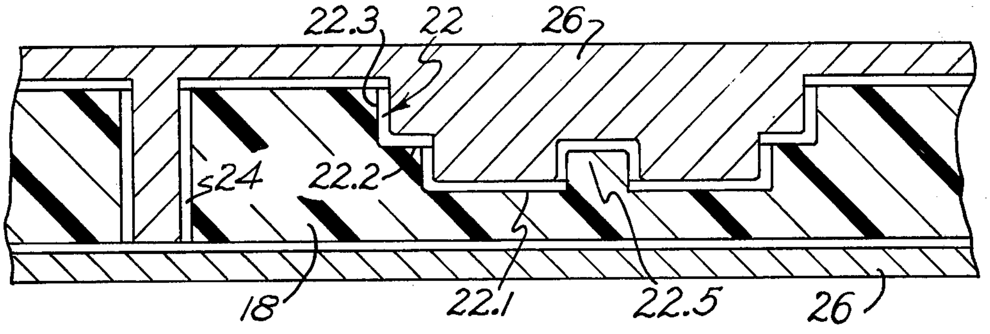
FIG. 9 is a partial section view similar to FIG. 6 illustrating a step in the novel method of manufacture provided by this invention.

In a preferred embodiment of this invention, the dielectric card 18 is formed from a somewhat rigid dielectric material such as acrylonitrile butadiene styrene (ABS) but other dielectric materials such as various phenolic resins, epoxies or the like are also used. Preferably, as is shown in FIG. 9, the dielectric card 18 is provided with the recesses 22, as well as with apertures 24 extending through the card, by molding the card between mold members 26 in any conventional manner. However, the recesses 22 and the apertures 24 are also formed by machining a body of dielectric material within the scope of this invention.

In this way, it can be seen that the dielectric card 18 is characterized by multilevel surfaces on one card side, these surfaces including the outer card surface 18.1, the surfaces formed by the tops of the recess shoulders 22.2, and the surfaces formed by the recess bottoms 22.1. In this latter regard, small projections 22.5 shown in FIGS. 5 and 9, are preferably formed in the bottoms of the recesses, these projections preferably being proportioned to be below the plane of the tops of the recess shoulders 22.2. Preferably also, the card is characterized by a significant thickness in the range from about 0.060 to 0.190 inches.

Figure 6:
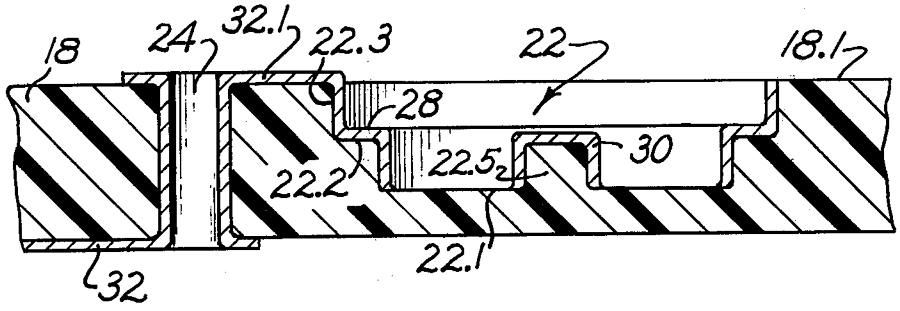
FIG. 6 is a partial section view along line 6—6 of FIG. 5.
Figure 8:
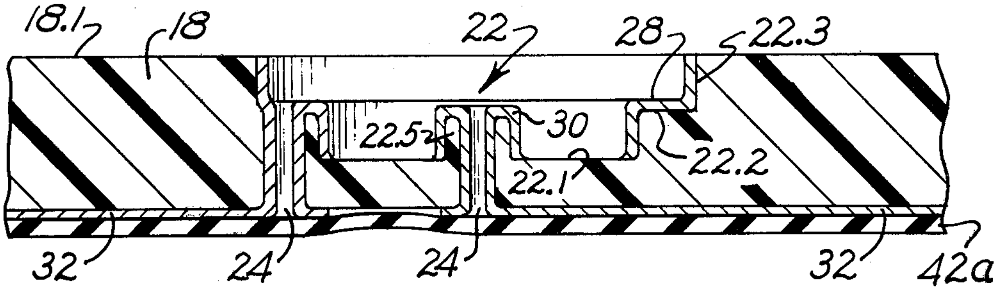
FIG. 8 is a partial section view similar to FIGS. 6 and 7 illustrating an alternate embodiment of the apparatus of this invention.

In accordance with this invention, the recessed, and preferably apertured, dielectric card 18 is provided with electrically conductive contact and circuit path means on the various different surface levels of the dielectric card as shown in FIGS. 5–7, these contact and circuit path means preferably being formed by depositing electrically conductive metal films on selected portions of the card in an additive type of process. Thus, the card is preferably provided with first electrical contacts 28 on top of the shoulders 22.2 within respective card recesses. The card is also provided with complementary electrical contacts 30 disposed on the recess bottoms 22.1 in spaced relation to the first contacts 28, these contacts 30 preferably being formed on the projections 22.5 at the bottoms of the recesses as shown in FIGS. 6 and 7. In addition, the card 18 is also provided with a selected pattern of circuit paths by the noted deposition process as is indicated at 32 in FIGS. 5–7, these circuit paths being electrically connected to the various first and complementary contacts 28 and 30 in a desired manner. In a preferred embodiment of this invention, as shown in FIGS. 5–7, the main portion of the circuit path pattern 32 is formed on the side of the dielectric card 18 opposite from the card recesses 22 in a generally conventional configuration. The circuit path pattern is then extended through apertures 24 in the dielectric card 18 as shown in FIGS. 5–7. Finally, the circuit path pattern is electrically connected to the first contacts 28 and the complementary contacts 30 formed on the recessed side of the card 18. For example, as is best shown in FIGS. 5 and 6, the first contacts 28 are electrically connected to portions 32.1 of the circuit path pattern at the wall or rim of the card recesses 22 whereas the complementary contacts 30 are electrically connected to portions 32.2 of the circuit path pattern which extend along the ramp or inclined surface portions 22.4 of the respective recesses and across the recess bottom 22.1 as shown in FIGS. 5 and 7. In an alternate embodiment of this invention shown in FIG. 8, apertures 24 are formed in the bottom of each card recess 22 and at least the complementary contacts 30 formed on the bottoms of the recess are connected to the circuit path pattern 32 through these apertures 24 as shown in FIG. 8. If desired, a plastic film **42*a* is adhesively secured to the bottom side of the card 18 for sealing those apertures 24 which extend into the card recesses 22 as shown in FIG. 8. As will be understood, although the main part of the circuit path pattern 32 is shown to extend along the side of the card 18 opposite from the recessed card side, the circuit path pattern 32** could be formed entirely on the recessed card side within the scope of this invention.

Figure 10:
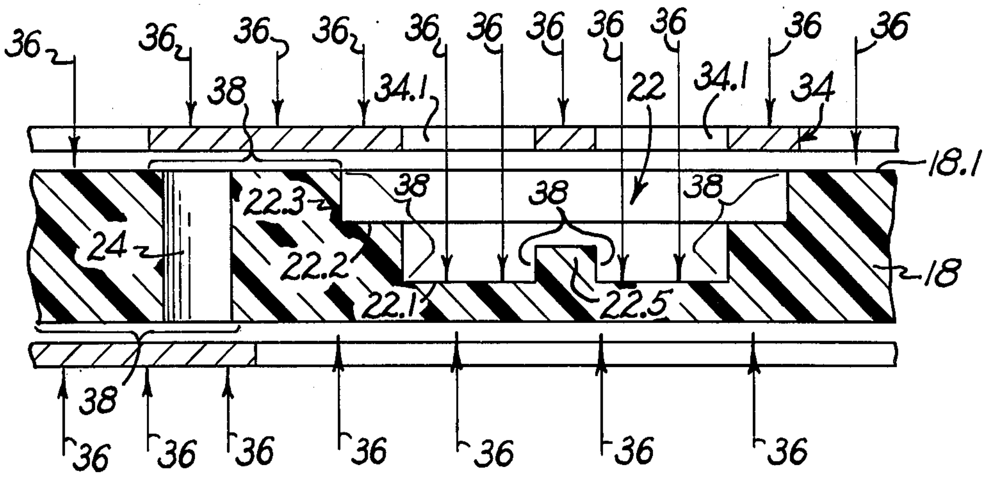
FIG. 10 is a partial section view similar to FIG. 9 illustrating a subsequent step in the method of this invention.

As will be understood, the first and complementary contacts 28 and 30, as well as the circuit path pattern 32, are formed on the recessed card 18 in any conventional manner. In a preferred embodiment of this invention, as is shown in FIG. 10 for example, the recessed card 18 as originally molded, is immersed in a highly concentrated aqueous solution of sodium hydroxide for sensitizing the surfaces of the card. After rinsing to remove sodium hydroxide residues, the card is immersed in an aqueous solution of tin chloride for depositing tin material on all of the card surfaces. After a further rinsing with water to remove excess tin chloride, the card is selectively exposed to ultraviolet radiation for changing the valence state of the tin material which is thus exposed. For example, as is shown in FIG. 10, mask members diagrammatically illustrated at 34 are positioned over the opposite sides of the dielectric card 18 and ultraviolet radiation, indicated at 36 in FIG. 10, is directed through translucent or apertured mask portions indicated at 34.1 so that the tin material on the surfaces of the card 18 which is exposed to this radiation is raised in its valence state. In this way, portions of the surfaces of the card 18 are shielded from this radiation as indicated at 38 in FIG. 10. Accordingly, the tin material on these card surface portions 38 remains in its original valence state as it was deposited on the card. This unirradiated tin material thus defines the card surfaces on which the electrical contacts 28 and 30 and the circuit path pattern 32 will be formed. Note that these unirradiated card surfaces include the vertical inner walls of the recesses 22 and of the card apertures 24. This selectively unirradiated card 18 is then immersed in an aqueous solution of palladium chloride for reacting palladium chloride with the unirradiated tin material on the card surfaces, thereby to form a palladium deposit on the surfaces defined by the unirradiated tin material. Finally, after further rinsing, the card is immersed in a conventional electroless nickel or copper plating bath for catalytically depositing nickel or copper of selected thickness on the palladium coated surfaces of the card 18, thereby to form the electrical contacts 28 and 30 and the circuit path pattern 32 as shown in FIGS. 6 and 7. As this selective metal deposition procedure is well known, it is not further described herein and it will be understood that use of this additive type of deposition process permits electrically conductive metal film to be formed on various levels of the multi-surface-level card 18 and within the card apertures 24 in a very economical manner. Alternately, other additive deposition processes of various conventional types can also be employed in forming the desired electrical contacts and circuit paths on the recessed card 18 within the scope of this invention. For example, the contacts 26 and 28 and the circuit path pattern 32 can be formed in silk-screening or direct printing process or the like. Any conventional process for selectively providing electrically conductive layers on different surface level portions of the recessed card 18 is considered to be within the scope of this invention.

The apparatus 10 of this invention further includes electrically conductive snap-acting switch elements 40 of a dished configuration which are disposed within respective recesses 22 in the dielectric card 18 and which are adapted to be moved with snap action to an inverted dished configuration in response to pressure applied thereto while providing a tactile response indicating this change of configuration of the element. These dished elements are proportioned so that the walls 22.3 of the recesses inherently position and retain the snap-acting elements in engagement with the first contacts 28 formed on the shoulders 22.2 of the card recesses but so that the snap-acting elements are normally spaced from the complementary contacts 30 formed on the bottom of the card recesses. Preferably, a thin, flexible plastic film 42 is then adhesively secured to the recessed side of the dielectric card as is shown in FIGS. 2–4. In this arrangement, the key means 20 mounted in apertures 12.1 in the top of the apparatus casing are positioned for selectively depressing the snap-acting elements 40 to an inverted dished configuration. That is, the keys 20 are typically provided with a cap portion 20.1 extending through an aperture 12.1 in the apparatus top, with a flange 20.2 which retains the key in the desired position in the aperture 12.1, and with a projecting portion 20.3 which rests on the flexible film 42. Each key 20 is thus adapted to be selectively depressed by finger pressure or the like for moving an electrically conductive element 40 with snap-action to an inverted dished configuration as shown in FIG. 4, thereby to close an electrical circuit between the first and complementary contacts 28 and 30 within a recess 22. The flexible film 42 permits the snap-acting element to be depressed in this manner and also serves to dust seal the recess 22 for preventing dust or other extraneous matter from coming between the dished element 40 and either of the electrical contacts 28 or 30 in the recess. In this regard, the portions 32.2 of the circuit path pattern formed on the card 18 extend across portions of the outer card surface 18.1, down the ramp surfaces 22.4 of the respective recesses, and across the bottoms of the recesses to electrically connect to the complementary contact 30 within the recesses. These circuit path portions thus extend beneath the rims of the snap-acting elements disposed on the recess shoulders 22.2 (see FIG. 7) and there is no risk of electrical contact between the snap-acting elements and these circuit path portions during assembly of the snap-acting elements 40 in the recesses. Thus, despite the ease of assembly, there is assurance that the contacts 28 and 30 are bridged by the snap-acting element only when depressed as shown in FIG. 3. The flexible film 42 secured over the card recesses 22 then serves to completely enclose each of the recesses to assure that each recess is kept free of dust and other extraneous matter, thereby to assure that depressing of the snap-acting element 40 can result in effective bridging contact between the contacts 28 and 30.

Figure 11:
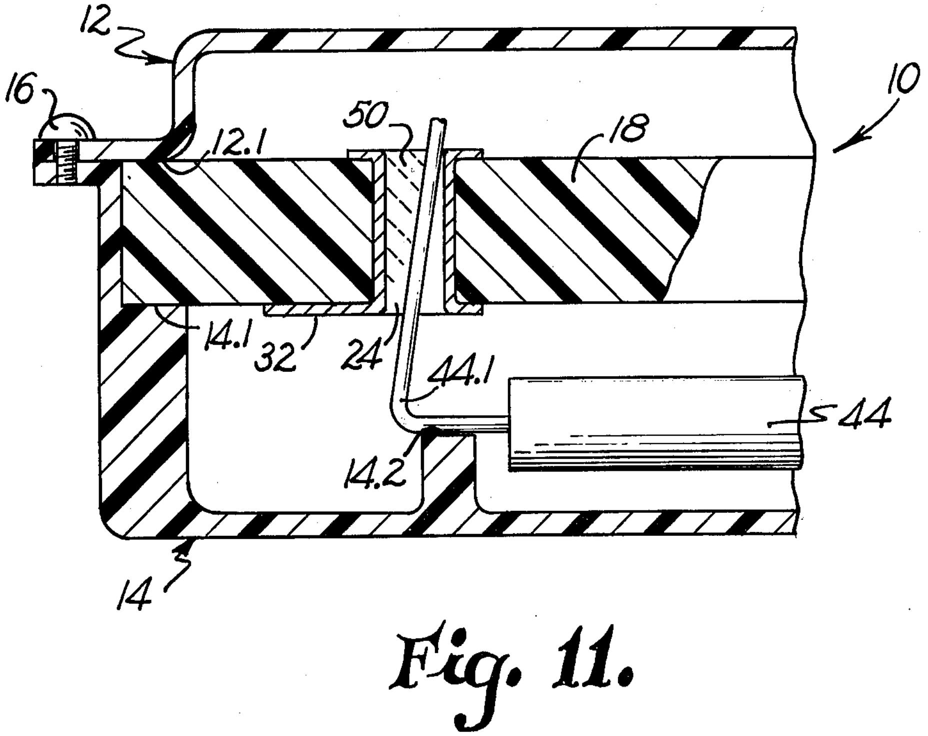
FIG. 11 is a partial section view along line 10—10 of FIG. 1 and is similar to FIG. 2 illustrating an additional aspect of the apparatus of this invention.

In accordance with this invention, the keyboard apparatus of this invention preferably includes various electronic components 44, 46 and 48 which are mounted directly on the dielectric card 18 for forming the complete electronic apparatus utilizing the single dielectric card. For example, where the keyboard apparatus 10 comprises a pocket-sized electronic calculator as shown in FIGS. 1 and 2, one or more integrated circuit devices 44 are mounted on the card 18 by inserting the i.c. device terminals 44.1 into apertures 24 which are formed in the card 18 and which are preferably lined by portions of the circuit path pattern 32 as shown particularly in FIG. 11. If desired, the casing halves are provided with stepped portions such as are indicated at 14.2 in FIGS. 2 and 11 for engaging the i.c. device terminals to detachably retain the i.c. devices in desired positions on the dielectric card 18. Further, as is also shown in FIG. 11, elements 50 of a conductive elastomer material such as carbon or metal-filled silicone rubber or the like are press-fitted or otherwise secured in the card apertures 24 to provide resilient pressing engagement and electrical contact between the i.c. device terminals and the circuit paths 32. Of course, various different configurations of conductive elastomers are used in this arrangement for achieving the desired electrical contact to the i.c. terminals 44.1 while permitting detachable mounting of the i.c. devices on the card 18.

Similarly, other electronic components such as an electrically operable display device 46 shown in FIG. 2 is also mounted on the card 18 by having terminals 46.1 of the display device inserted into card apertures 24 with or without the use of conductive elastomer members in these apertures, the display device extending out of the apparatus casing through an aperture 12.3 in the casing top. Similarly, a battery 48 or other power source means is also disposed in the apparatus 10 and has its terminals 48.1 electrically connected to the circuit paths 32 on the card 18 as will be understood. In this way, the keyboard contacts 28 and 30 cooperate with the circuit path pattern 32 and with the circuit components 44, 46 and 48 and such other devices as may be mounted on the card 18 to provide a complete electronic circuit for the keyboard apparatus 10, the keyboard switch elements 40 being available for selectively closing apparatus circuits as required in device operation.

It should be understood that although particular embodiments of the apparatus and method of this invention have been described by way of illustrating the inventions, the invention includes all modifications and equivalents of the disclosed embodiments falling within the scope of the appended claims.

We claim:

1. A keyboard apparatus comprising a dielectric card having a plurality of recesses in one card side, first electrically conductive contacts disposed in respective card recesses, complementary electrically conductive contacts disposed in respective card recesses in spaced relation to the first contacts within said recesses, a selected pattern of circuit path means on said card connected to said contacts, a plurality of electrically conductive elements each having a dished configuration movable with snap-action to an inverted dished configuration in response to pressure applied thereto, said snap-acting elements being disposed in an open circuit position in said respective card recesses in engagement with one of said contacts in said recesses and spaced from another of said contacts in said recesses, and key means movably mounted at said recessed card side for selectively pressing said respective snap-acting elements toward said inverted dished configuration to additionally engage another of said contacts in said recesses for closing a circuit.

2. A keyboard apparatus as set forth in claim 1 having electronic components mounted on said dielectric card, said components having terminal means electrically connected to said circuit path means on said card, and having casing means enclosing said card retaining said key means and electronic components in said described relation.

3. A keyboard apparatus as set forth in claim 2 wherein said card has apertures therein, said components have terminals extending therefrom into said apertures for detachably mounting said components on said card, and wherein electrically conductive elastomer means are mounted on said apertures bearing against said component terminals for electrically connecting said terminals to said circuit path means.

4. A keyboard apparatus comprising a dielectric card having a plurality of recesses in one card side defining card surface portions within said recesses at one surface level and defining other card surface portions within said recesses at another surface level, electrically conductive film means on said card defining a plurality of first electrically conductive contacts within said respective recesses at said one surface level, defining a plurality of complementary electrically conductive contacts within said respective recesses at said other surface level spaced from said first contacts, and defining circuit paths on said card connected to said contacts in a predetermined manner, a plurality of electrically conductive elements each having a dished configuration movable with snap action to an inverted dished configuration in response to pressure applied thereto, said snap-acting elements each being disposed in an open circuit position in one of said recesses in engagement with the first contact in said recess and spaced from the complementary contact in said recess, and a plurality of key means movably mounted at said one card side for selectively pressing respective snap-acting elements toward said inverted dished configuration to additionally engage one of said complementary contacts for closing a circuit.

5. A keyboard apparatus comprising a card of dielectric material having a plurality of recesses in one card side, said recesses each having a bottom, a shoulder extending around at least a part of said bottom, and a wall upstanding from said shoulder in at least partially surrounding relation to said shoulder, a plurality of electrically conductive films within respective card recesses secured to said recess shoulders for forming electrical contacts in said recesses, a plurality of electrically conductive films within respective card recesses secured to said recess bottoms for forming complementary electrical contacts spaced from said first contacts, and electrically conductive film means secured to said card forming circuit path means electrically connected to said contacts in a predetermined manner, a plurality of electrically conductive elements each having a dished configuration movable with snap-action to an inverted dished configuration in response to pressure applied thereto, said snap-acting elements being disposed within respective card recesses on said recess shoulders to be located by said recess walls in an open circuit position in engagement with the first contacts on said recesses and spaced from the complementary contacts in said recesses, and a plurality of key means mounted at said one card side for selectively pressing respective snap-acting elements toward said inverted dished configuration to additionally engage one of said complementary contacts for closing a circuit.

6. A keyboard apparatus as set forth in claim 5 having flexible plastic film means secured to said card for dust sealing said card recesses.

7. A keyboard apparatus as set forth in claim 5 wherein each of said recesses has an inclined surface extending from said recess bottom beneath the plane of said recess shoulder to the outer surface of said one card side and portions of said circuit path means electrically connected to said complementary contacts in said recesses extend along said respective inclined surfaces of said recesses.

8. A keyboard apparatus as set forth in claim 7 having a flexible plastic film secured to said one card side for dust sealing said card recesses.

9. A keyboard electronic apparatus comprising a dielectric card of selected thickness having a plurality of multilevel recesses in one card side, said recesses each having a bottom at one surface level, a shoulder extending around at least part of said bottom at a second surface level, a wall upstanding from said shoulder in at least partially surrounding relation to said shoulder, and an additional surface extending from said recess bottom beneath the plane of said recess shoulder outside of said recess wall and up to said one card side, a plurality of first electrically conductive metal film members within respective card recesses secured to said recess shoulders for forming first electrical contacts in said recesses, a plurality of second electrically conductive metal film members within respective recesses secured to said recess bottoms for forming complementary electrical contacts in said recesses spaced from said first contacts in said recesses, other electrically conductive film means secured to said card forming selected circuit paths electrically connected to said contacts, said other film means having portions connected to said first contacts at said recess walls and portions extending along said additional surfaces to be electrically connected to said complementary contacts, a plurality of electrically conductive metal elements each having a dished configuration movable with snap action to an inverted dished configuration in response to pressure applied thereto, said snap-acting elements being disposed within respective card recesses on said recess shoulders to be located by said recess walls in engagement with first contacts in said recesses and spaced from complementary contacts in said recesses, flexible plastic film means secured to said one card side dust sealing said recesses, a plurality of key means mounted at said one card side for selectively pressing respective snap-acting elements through said flexible film means toward said inverted dished configuration to additionally engage said complementary contacts for selectively closing circuits, and electronic components electrically connected to said circuit paths on said card in a selected manner.

10. A keyboard electronic apparatus as set forth in claim 9 wherein said dielectric card has a plurality of apertures extending through said card, and said electronic components have terminals extending therefrom into said card apertures for mounting said components on said card.

11. A keyboard electronic apparatus as set forth in claim 10 wherein said card has a thickness in the range from about 0.060 to 0.190 inches and conductive elastomer means are disposed on said card apertures resiliently bearing against said component terminals for detachably retaining said terminals on said apertures in electrically connected relation to said circuit paths on said card.

12. A switch arrangement comprising:

a molded plastic board with a pattern of recesses molded into one surface and a hole extending through the board in the central region of each recess;

a pattern of conductive material on said board, said pattern comprising through-plating in each said hole, a patch of said material placed centrally in the bottom of said recess and connected to said through-plating, and a portion around the periphery of said recess in its bottom and extending up the wall and over the lip of the recess; and a dome in each recess, the rim of said dome being in contact with said peripheral portion, and the peak of said dome being poised above said central patch when undeflected, and being deflectable into contact with said patch.

13. A keyboard apparatus comprising a dielectric card having a plurality of recesses in one card side, first electrically conductive contacts disposed in respective card recesses, complementary electrically conductive contacts disposed in respective card recesses in spaced relation to the first contacts within said recesses, a selected pattern of circuit path means on said card connected to said contacts, and a plurality of electrically conductive elements each having a dished configuration movable with snap-action to an inverted dished configuration in response to pressure applied thereto, said snap-acting elements being disposed in an open circuit position in said respective card recesses in engagement with one of said contacts in said recesses and spaced from another of said contacts in said recesses, said respective snap-acting elements being adapted to be pressed toward said inverted dished configuration to additionally engage another of said contacts in said recesses for closing a circuit.

14. A keyboard apparatus comprising a card of dielectric material having a plurality of recesses in one card side, said recesses each having a bottom, a shoulder extending around at least a part of said bottom, and a wall upstanding from said shoulder in at least partially surrounding relation to said shoulder, a plurality of electrically conductive films within respective card recesses secured to said recess shoulders for forming electrical contacts in said recesses, a plurality of electrically conductive films within respective card recesses secured to said recess bottoms for forming complementary electrical contacts spaced from said first contacts, and electrically conductive film means secured to said card for forming circuit path means electrically connected to said contacts in a predetermined manner, and a plurality of electrically conductive resilient elements each having a configuration restorably movable to a dished configuration in response to pressure applied thereto, said resilient elements being disposed within respective card recesses on said recess shoulders to be located by said recess walls in an open circuit position in engagement with the first contacts on said recesses and spaced from the complementary contacts in said recesses, said resilient elements being adapted to be selectively pressed toward said dished configuration to additionally engage one of said complementary contacts for closing a circuit.

* * * * *